United States Patent
Matsumoto (10) Patent No.: US 10,658,158 B2
(45) Date of Patent: May 19, 2020

(54) APERTURE SET FOR MULTI-BEAM

(71) Applicant: NuFlare Technology, Inc., Yokohama-shi (JP)

(72) Inventor: Hiroshi Matsumoto, Yokohama (JP)

(73) Assignee: NuFlare Technology, Inc., Yokohama-shi (JP)

(*) Notice: Subject to any disclaimer, the term of this patent is extended or adjusted under 35 U.S.C. 154(b) by 0 days.

(21) Appl. No.: 16/202,553

(22) Filed: Nov. 28, 2018

(65) Prior Publication Data
US 2019/0189395 A1    Jun. 20, 2019

(30) Foreign Application Priority Data

Dec. 14, 2017 (JP) .................. 2017-239396

(51) Int. Cl.
*H01J 37/317* (2006.01)
*H01J 37/04* (2006.01)

(52) U.S. Cl.
CPC ........ *H01J 37/3177* (2013.01); *H01J 37/045* (2013.01); *H01J 2237/0262* (2013.01); *H01J 2237/0435* (2013.01); *H01J 2237/0437* (2013.01); *H01J 2237/0453* (2013.01)

(58) Field of Classification Search
CPC .............. H01J 37/3177; H01J 37/045; H01J 2237/0437
USPC ...... 250/396 R, 397, 398, 400, 492.1, 492.2, 250/492.22, 492.3
See application file for complete search history.

(56) References Cited

U.S. PATENT DOCUMENTS

2014/0231668 A1* 8/2014 Yasuda .................. B82Y 40/00
250/396 R

FOREIGN PATENT DOCUMENTS

| JP | 8-17698 | 1/1996 |
| JP | 2002-319532 | 10/2002 |
| JP | 2009-32691 | 2/2009 |
| JP | 2016-76548 | 5/2016 |
| JP | 2017-108146 | 6/2017 |
| JP | 2017-216338 | 12/2017 |

\* cited by examiner

*Primary Examiner* — Nicole M Ippolito
*Assistant Examiner* — Hanway Chang
(74) *Attorney, Agent, or Firm* — Oblon, McClelland, Maier & Neustadt, L.L.P.

(57) ABSTRACT

In one embodiment, an aperture set for multi-beam includes a shaping aperture array in which a plurality of first openings are formed, and which forms a multi-beam by allowing part of a charged particle beam to pass through corresponding ones of the plurality of first openings, a blanking aperture array in which a plurality of second openings are formed, the plurality of second openings each including a pair of blanking electrodes that perform blanking deflection of a beam, and an electric field shield plate that is disposed to be opposed to the blanking aperture array and includes a plurality of third openings. The electric field shield plate has a substrate, and a high resistance film provided on a surface of the substrate, the surface being opposed to the blanking aperture array, and the high resistance film has a higher electrical resistance value than an electrical resistance value of the substrate.

15 Claims, 5 Drawing Sheets

| | Material | Volume resistivity ($\Omega$m) | Thickness ($\mu$m) | Cell width ($\mu$m) | Resistance in thickness direction ($\Omega$) | Resistance in surface direction ($\Omega$) |
|---|---|---|---|---|---|---|
| Substrate | Impurity doped Si | 1 | 30 | 32 | $3.1 \times 10^4$ | $3.1 \times 10^4$ |
| Insulation film | $SiO_2$ | $1 \times 10^{20}$ | 0.01 | 32 | $9.8 \times 10^{20}$ | $1.0 \times 10^{28}$ |
| High resistance film | Ge | 1 | 0.01 | 32 | 9.8 | $1.0 \times 10^8$ |

APERTURE SET FOR MULTI-BEAM

CROSS REFERENCE TO RELATED APPLICATION

This application is based upon and claims benefit of priority from the Japanese Patent Application No. 2017-239396, filed on Dec. 14, 2017, the entire contents of which are incorporated herein by reference.

FIELD

The present invention relates to an aperture set for multi-beam.

BACKGROUND

With an increase in the packing density of LSIs, the required linewidths of circuits included in semiconductor devices become finer year by year. To form a desired circuit pattern on a semiconductor device, a method is employed in which a high-precision original pattern (i.e., a mask, or also particularly called reticle, which is used in a stepper or a scanner) formed on quartz is transferred to a wafer in a reduced manner by using a reduced-projection exposure apparatus. The high-precision original pattern is written by using an electron-beam writing apparatus, in which a so-called electron-beam lithography technique is employed.

A writing apparatus using a multi-beam can irradiate with many beams at once, as compared with the case where writing is performed by a single electron beam, thus the throughput can be significantly improved. In a multi beam writing apparatus that uses a blanking aperture array, which is one form of multi beam writing apparatus, for instance, electron beams discharged from an electron gun are passed through a shaping aperture array having multiple openings, and a multi-beam (multiple electron beams) is formed. The multi-beam each passes through a corresponding one of blankers of the blanking aperture array. The blanking aperture array includes an electrode pair for deflecting a beam individually, and an opening for beam passage between the electrode pair, and one of the electrode pair (blanker) is fixed to the ground potential, and blanking deflection is performed individually on a passing electron beam by switching the other electrode between the ground potential and a potential other than the ground potential. An electron beam deflected by a blanker is shielded, and a sample is irradiated with an electron beam not deflected.

In a conventional multi-beam writing apparatus, the path of each beam is slightly curved due to the effect of an electric field which leaks from the blanker of an adjacent beam, a beam irradiation position on the surface of the sample is displaced, and thus the writing accuracy may deteriorate.

DETAILED DESCRIPTION

In one embodiment, an aperture set for multi-beam includes a shaping aperture array in which a plurality of first openings are formed, and which receives irradiation of a charged particle beam discharged from a discharge unit in an area including the plurality of first openings, and forms a multi-beam by allowing part of the charged particle beam to pass through corresponding ones of the plurality of first openings, a blanking aperture array in which a plurality of second openings are formed, through each of which a beam is passed, corresponding to part of the multi-beam, the plurality of second openings each including a pair of blanking electrodes that perform blanking deflection of a beam, the pair of blanking electrodes being provided oppositely across the second opening, and an electric field shield plate that is disposed to be opposed to the blanking aperture array and includes a plurality of third openings, through each of which a beam is passed, corresponding to part of the multi-beam. The electric field shield plate has a substrate, and a high resistance film provided on a surface of the substrate, the surface being opposed to the blanking aperture array, and the high resistance film has a higher electric resistance than an electric resistance of the substrate.

Hereinafter, an embodiment of the present invention will be described based on the drawings. In the embodiment, as an example of a charged particle beam, a configuration using an electron beam will be described. However, the charged particle beam is not be limited to an electron beam, and may be an ion beam or the like.

Figure 1:
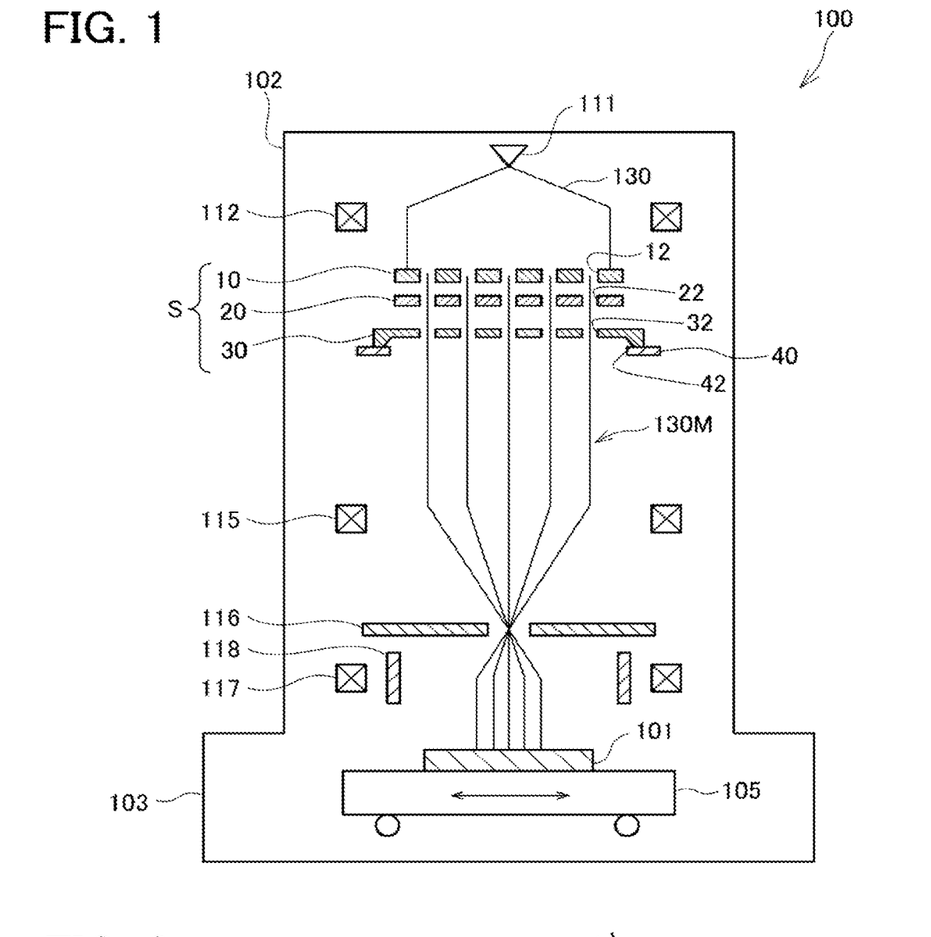
FIG. 1 is a schematic diagram of a multi charged particle beam writing apparatus according to the present embodiment.

FIG. 1 is a schematic configuration diagram of a writing apparatus according to an embodiment. A writing apparatus 100 illustrated in FIG. 1 is an example of a multi charged particle beam writing apparatus. The writing apparatus 100 includes an electron optical column 102 and a writing chamber 103. In the electron optical column 102, an electron gun 111, an illumination lens 112, an aperture set S, a reducing lens 115, a limiting aperture member 116, an objective lens 117, and a deflector 118 are disposed.

The aperture set S has a shaping aperture array 10 (a shaping aperture array plate), a blanking aperture array 30 (a blanking aperture array plate), and an electric field shield plate 20. The blanking aperture array 30 is mounted (installed) in a mounting substrate 40, and circuits are connected by die bonding or wire bonding. An opening 42 for passage of an electron beam (multi-beam 130M) is formed at a central portion of the mounting substrate 40. When shaping the multi-beam 130M, the shaping aperture array 10 blocks the most of the electron beams 130, and thus generates heat and thermally expands. For this reason, the shaping aperture array 10 is set on a movable stage and position adjustment is made so that the multi-beam 130M passes through a through aperture of the blanking aperture array 30.

The aperture set S may include another aperture. For instance, a contrast aperture (a contrast aperture plate), which blocks scattered electrons which have occurred in the shaping aperture array 10, may be set below or above the blanking aperture array 30.

An XY stage 105 is disposed in the writing chamber 103. At the time of writing, a sample 101, such as a mask, which serves as a writing target substrate, is disposed on the XY stage 105. The sample 101 includes an exposure mask when a semiconductor device is manufactured, or a semiconductor substrate (silicon wafer) on which a semiconductor device is mounted. Also, the sample 101 includes a mask blank, to which resist is applied, and on which nothing has been written yet.

Figure 2:
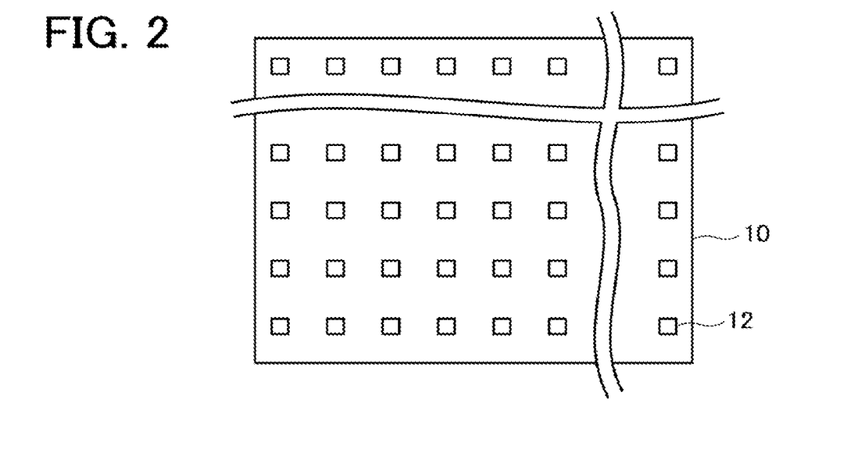
FIG. 2 is a schematic diagram of a shaping aperture array.

As illustrated in FIG. 2, in the shaping aperture array 10, openings (first openings) 12 in m vertical columns×n horizontal columns (m, n≥2) are formed with a predetermined arrangement pitch. Each of the openings 12 is formed in a rectangle having the same dimensional shape. The shape of the openings 12 may be circular. Part of the electron beams B passes through corresponding ones of these multiple openings 12, thereby forming the multi-beam 130M.

The blanking aperture array 30 is provided under the shaping aperture array 10, and passage openings (second openings) 32 are formed, each of which corresponds to one of the openings 12 of the shaping aperture array 10. On the lower surface side of the blanking aperture array 30, a blanker consisting of a pair of two blanking electrodes 34 (see FIG. 3) is disposed in the vicinity of each of the passage openings 32. One of the blanking electrodes 34 is fixed to the ground potential, and the other blanking electrode is switched between the ground potential and another potential. The pair of two blanking electrodes 34 is provided oppositely across the passage opening 32.

The electron beam, which passes through each passage opening 32, is independently deflected by a voltage applied to the blanker. In this manner, the multiple blankers each perform blanking deflection of a corresponding part of the multi-beam 130M which has passed through the multiple openings 12 of the shaping aperture array 10.

Figure 3:
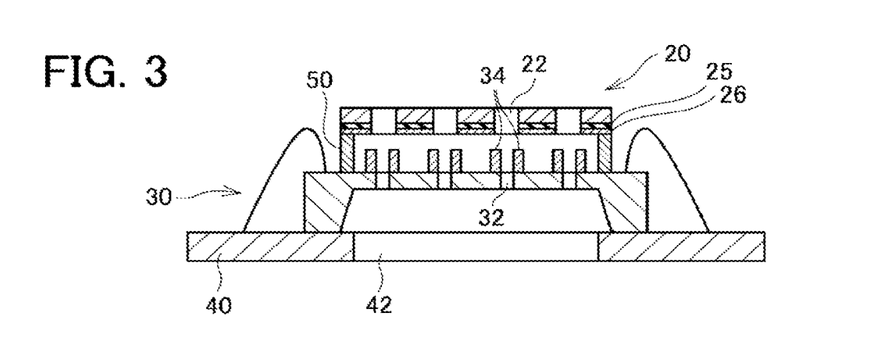
FIG. 3 is a side view illustrating an example of mounting of an electric field shield plate.
Figure 4A:
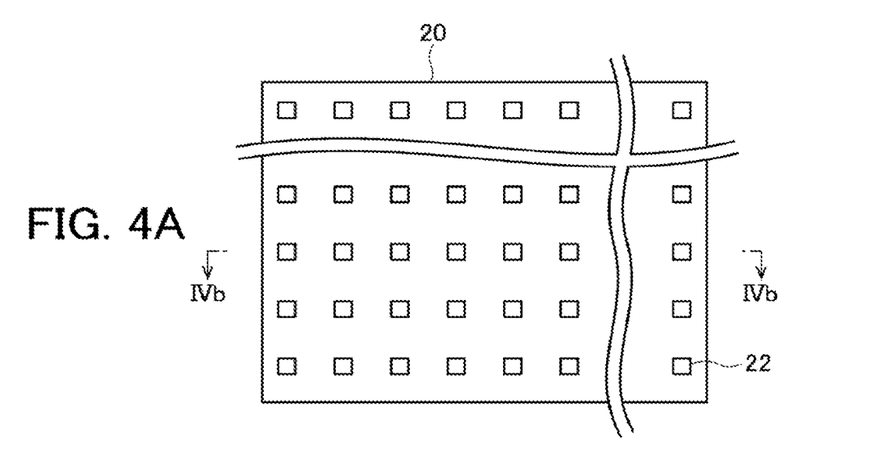
FIG. 4A is a plan view of an electric field shield plate.
Figure 4B:
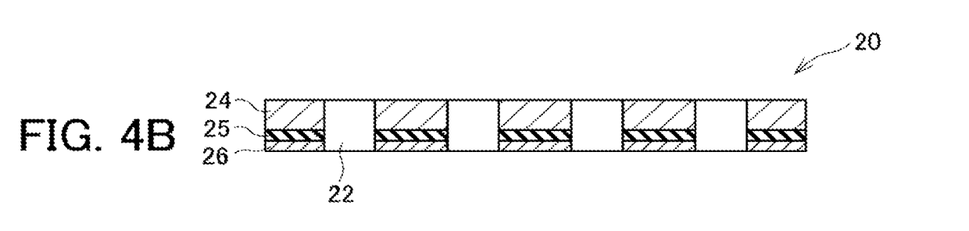
FIG. 4B is a view illustrating part of a cross-section taken along line IVb-IVb.

As illustrated in FIG. 3, the electric field shield plate 20 is provided above the blanking aperture array 30 with spacers 50 interposed therebetween. It is preferable that the interval between the upper end of the blanking electrodes 34 and the lower surface of the electric field shield plate 20 be smaller than an arrangement pitch of the electrodes. For instance, when the arrangement pitch of the electrodes is 32 μm, it is preferable that the interval between the upper end of the blanking electrodes 34 and the lower surface of the electric field shield plate 20 be approximately 10 μm. As illustrated in FIGS. 4A and 4B, openings (third openings) 22 are formed in the electric field shield plate 20 according to the arrangement positions of each opening 12 of the shaping aperture array 10 and each passage opening 32 of the blanking aperture array 30. The diameter of each opening 22 is greater than the diameter of each passage opening 32.

The electric field shield plate 20 has a substrate 24 connected to the ground, an insulation film 25 provided on the substrate 24, and a high resistance film 26 provided on the insulation film 25. The substrate 24 has conductivity, and for instance, a silicon substrate, in which p-type impurity such as boron is doped, can be used. The insulation film 25 is, for instance, a silicon oxide film.

The high resistance film 26 has a higher resistance than the substrate 24 has in a surface direction, and has a sheet resistance in the order of 1 to 100 MΩ. For instance, a film made of a semiconductor material such as germanium or a metal film such as an aluminum film having a film thickness of 10 nm or less may be used as the high resistance film 26. Although not illustrated, a metal film is slightly provided on the sidewalls of each opening 22, and electrical connection between the high resistance film 26 and the substrate 24 is established by an opening end face. The electric field shield plate 20 is disposed so that the high resistance film 26 is opposed to the blanking aperture array 30.

Figure 5A:
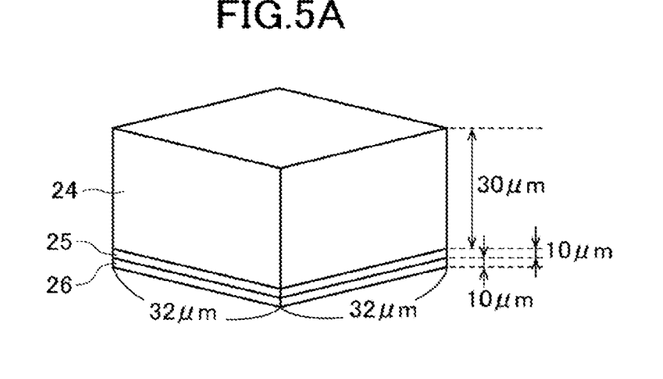
FIG. 5A is a schematic diagram of one cell of the electric field shield plate.

FIG. 5A is a schematic diagram of one cell, surrounded by openings 22, of the electric field shield plate 20. The size of a shield piece in the surface direction is set to 32 μm×32 μm. Let the substrate 24 be an impurity-doped silicon substrate having a thickness of 30 μm. Let the insulation film 25 be a silicon oxide film having a film thickness of 10 nm. Let the high resistance film 26 be a germanium film having a film thickness of 10 nm.

Figure 5B:
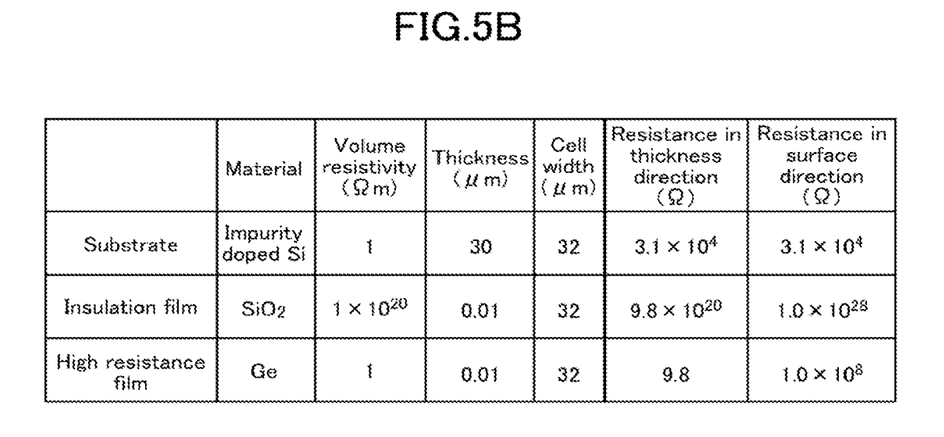
FIG. 5B is a table illustrating resistance values of layers.

In this case, the resistance in the thickness direction and the resistance in the surface direction of the substrate 24, the insulation film 25, and the high resistance film 26 are as shown in the table illustrated in FIG. 5B. The high resistance film 26 has a high resistance in the surface direction. The high resistance film 26 has a higher electrical resistance value (in the surface direction) than the blanking electrode 34 and the substrate 24 have.

In the writing apparatus 100 in which such an aperture set S is set, the electron beam 130 discharged from the electron gun 111 (discharge unit) substantially perpendicularly illuminates the entire shaping aperture array 10 by the illumination lens 112. The electron beam 130 passes through multiple openings 12 of the shaping aperture array 10, thereby forming multiple electron beams (multi-beam) 130M. The multi-beam 130M passes through the openings 22 of the electric field shield plate 20, and subsequently each passes through between corresponding blankers of the blanking aperture array 30.

The multi-beam 130M, which has passed through the blanking aperture array 30, is reduced by the reducing lens 115, and travels to an opening at the center of the limiting aperture member 116. Here, an electron beam deflected by the blanker of the blanking aperture array 30 is displaced from the opening at the center of the limiting aperture member 116 and is blocked by the limiting aperture member 116. On the other hand, an electron beam not deflected by the blanker passes through the opening at the center of the limiting aperture member 116. Blanking control is performed by ON/OFF of the blanker, and ON/OFF of a beam is controlled.

In this manner, the limiting aperture member 116 blocks the beams which are deflected by the multiple blankers to have a beam-off state. The beam, which has passed through the limiting aperture member 116 in a period from beam ON until beam OFF is achieved, forms the beam for one shot.

The multi-beam, which has passed through the limiting aperture member 116, is focused by the objective lens 117 to form a pattern image having a desired reduction ratio. The entire multi-beams are collectively deflected by the deflector 118 in the same direction, and are emitted to respective irradiation positions of the beams on the sample 101. When the XY stage 105 is continuously moved, the irradiation position of each beam is controlled by the deflector 118 so as to follow the movement of the XY stage 105.

Ideally, the multi-beams irradiated at once are arranged with a pitch which is obtained by multiplying the arrangement pitch of the multiple openings 12 of the shaping aperture array 10 by the above-mentioned desired reduction ratio. The writing apparatus 100 performs a writing operation by a raster scan system by which a shot beam is continuously emitted sequentially, and when a desired pattern is written, an unnecessary beam is controlled to be beam-OFF by the blanking control.

When beam is set off by the blanking control, for instance, a positive potential is applied to one blanking electrode 34 of the blanker, and the other electrode is always maintained at the ground potential. When the electric field generated from the blanking electrode 34, to which a positive potential is applied, leaks and spreads over the path of an adjacent beam, the path of the adjacent beam is curved accidentally, and when the adjacent beam is controlled to be ON, deviation of the irradiation position on the sample 101 occurs. However, since the electric field shield plate 20 is provided above the blanking aperture array 30 in this embodiment, it is possible to prevent the leaked electric field from spreading over the path of the adjacent beam, and to prevent occurrence of positional deviation of the position on the sample 101, where the occurrence of positional deviation may be caused if the path of a beam is curved depending on ON/OFF control states of the surrounding beams.

The electric field shield plate 20 is closely disposed to be opposed and parallel (substantially parallel) to the upper surface of the blankers of the blanking aperture array 30 (or the major surface of the blanking aperture array 30), thereby making it possible to effectively prevent the leaked electric field from spreading. It is preferable that the interval between the front end of the blanking electrodes 34 and the lower surface of the electric field shield plate 20 be smaller than the arrangement interval of the passage openings 32 of the blanking aperture array 30. When the arrangement interval is 32 µm, the electric field shield plate 20 is disposed so that the interval between the upper end of the blanking electrodes 34 and the lower surface of the electric field shield plate 20 is approximately 10 µm.

Figure 6:
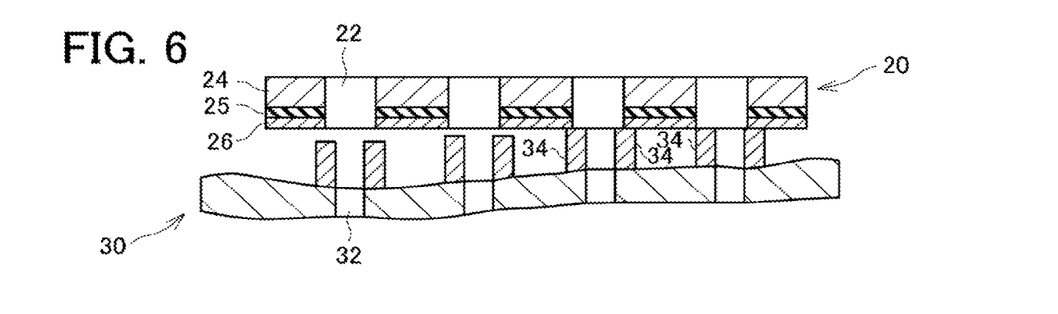
FIG. 6 is a view illustrating an example of a state where an electric field shield plate and an electrode are in contact.

The size of the blanking aperture array 30 in a large scale exceeds 10 mm×10 mm, and thus it is difficult to keep the warpage of the substrate of the blanking aperture array 30 less than or equal to 10 µm. Therefore, when the electric field shield plate 20 is disposed in the vicinity of the blanking aperture array 30, as illustrated in FIG. 6, the blanking aperture array 30 warps, and some blanking electrodes 34 may come into contact with the electric field shield plate 20. For instance, when the mounting substrate 40 of the blanking aperture array 30 is fixed for device mounting, a stress is applied to the mounting substrate 40 and the blanking aperture array 30, and here is a possibility that the blanking aperture array 30 warps.

The high resistance film 26 is provided on the surface of the electric field shield plate 20, which is opposed to the blanking aperture array 30, and some blanking electrodes 34 come into contact with the high resistance film 26. As described above, the high resistance film 26 has an extremely high resistance in the surface direction, thus even when some blanking electrodes 34 come into contact with the high resistance film 26, a weak current flows only. The substrate 24 and the high resistance film 26 having conductivity via a metal film provided in the sidewall of each opening 22 are electrically connected, and the high resistance film 26 is at the ground potential. Thus, it is possible to prevent short-circuit between the blanking electrodes 34, and to protect an electrode drive circuit of the blanking aperture array 30.

Next, a method of manufacturing the electric field shield plate 20 will be described with reference to FIGS. 7A to 7G.

Figure 7A:
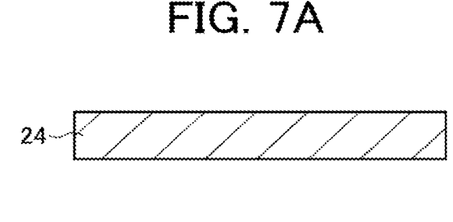
FIGS. 7A to 7G are process sectional views for explaining a method of manufacturing an electric field shield plate.
Figure 7B:
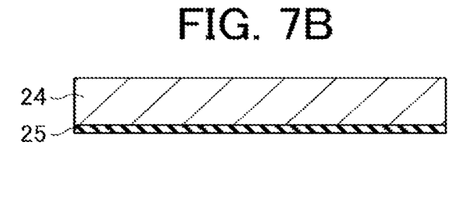

First, as illustrated in FIG. 7A, a p-type impurity doped silicon substrate 24 is prepared. Subsequently, as illustrated in FIG. 7B, the insulation film 25 composed of a silicon oxide film is formed on one of the surfaces of the silicon substrate 24 by thermal oxidation processing.

Figure 7C:
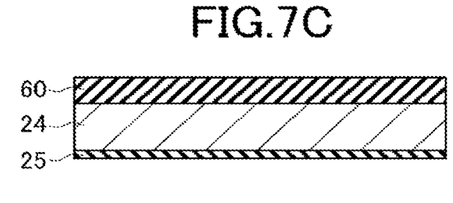
Figure 7D:
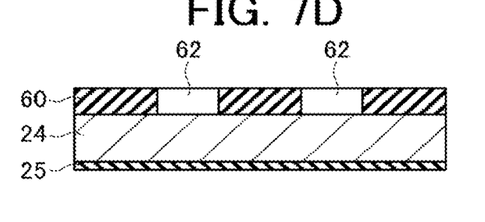

As illustrated in FIG. 7C, resist 60 is applied to the other surface of the silicon substrate 24. As illustrated in FIG. 7D, a hole pattern 62 is formed in the resist 60 by exposure and development processing.

Figure 7E:
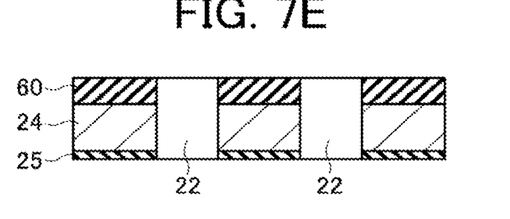
Figure 7F:
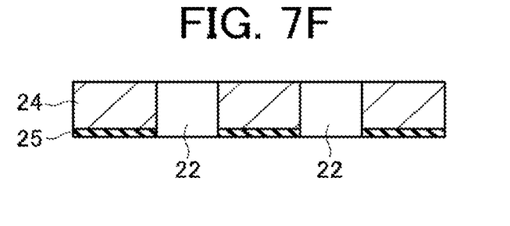

As illustrated in FIG. 7E, the silicon substrate 24 and the insulation film 25 are etched using the resist 60 as a mask to form openings 22. Subsequently, as illustrated in FIG. 7F, the resist 60 is stripped by ashing treatment.

Figure 7G:
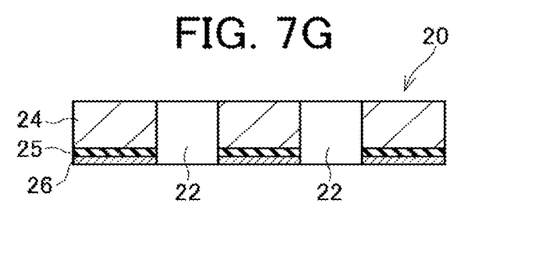

As illustrated in FIG. 7G, the high resistance film 26 is formed on the insulation film 25 by sputtering, the high resistance film 26 being composed of a film made of a semiconductor material such as germanium or a thin metal film such as an aluminum film having a film thickness of 10 nm or less. At this point, a thin metal film (not illustrated) is also formed on the sidewall of the opening 22, and it is possible to establish electrical connection between the silicon substrate 24 and the high resistance film 26.

In this manner, the electric field shield plate 20 is provided above the blanking aperture array 30 according to this embodiment, and thus it is possible to prevent the surrounding beams from being affected by an electric field which has spread from the blankers, and to prevent the path of a beam to be curved.

In addition, the high resistance film 26 is provided on the lower surface of the electric field shield plate 20, thus even when some blanking electrodes 34 come into contact with the electric field shield plate 20, short-circuit between the blanking electrodes 34 can be prevented. Therefore, the electric field shield plate 20 can be disposed closely to the blanking aperture array 30, and thus the effect of an electric field which has leaked from the blankers can be effectively suppressed.

Although the configuration has been described in which the electric field shield plate 20 is provided above the blanking aperture array 30 in the embodiment, the electric field shield plate 20 may be provided below the blanking aperture array 30. In this case, the high resistance film 26 is provided on the upper surface of the electric field shield plate 20, that is, the surface of the electric field shield plate 20, which is opposed to the blanking aperture array 30.

Although an electric field shield plate, in which an insulation film and a high resistance film are sequentially stacked on a conductive substrate, is used in the embodiment, a substrate in a single layer structure composed of a high resistance material may be used as the electric field shield plate.

Alternatively, an electric field shield plate, in which a high resistance film is stacked on an insulating substrate, and a conductive film is formed on the sidewall of each opening, may be used. A method of manufacturing such an electric field shield plate will be described with reference to FIGS. 8A to 8H.

Figure 8A:
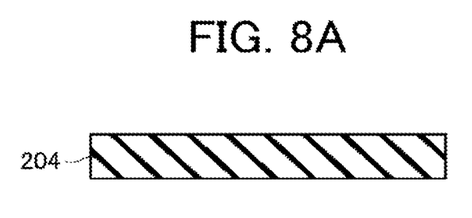
FIGS. 8A to 8H are process sectional views for explaining a method of manufacturing an electric field shield plate according to a modification.
Figure 8B:
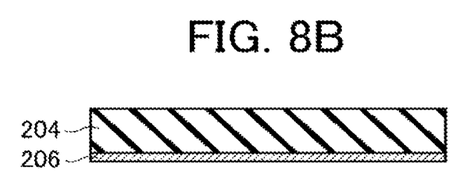

First, as illustrated in FIG. 8A, an insulating substrate 204 composed of a silicon substrate 204, in which impurities are not doped, is prepared. Subsequently, as illustrated in FIG. 8B, a high resistance film 206 composed of a thin metal film such as germanium or aluminum film is formed on one of the surfaces of the silicon substrate 204 by sputtering.

Figure 8C:
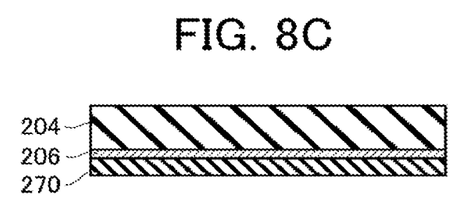

As illustrated in FIG. 8C, a protective film 270 is formed on the high resistance film 206. The protective film 270 is, for instance, a silicon nitride film.

Figure 8D:
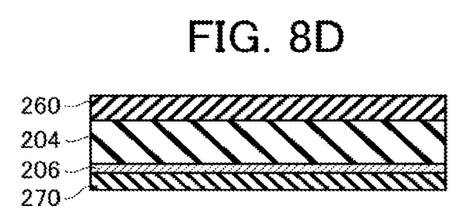
Figure 8E:
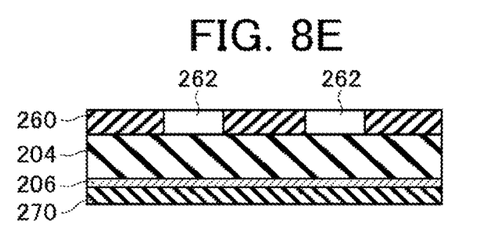

As illustrated in FIG. 8D, resist 260 is applied to the other of the surfaces of the insulating substrate 204. As illustrated in FIG. 8E, a hole pattern 262 is formed in the resist 260 by exposure and development processing.

Figure 8F:
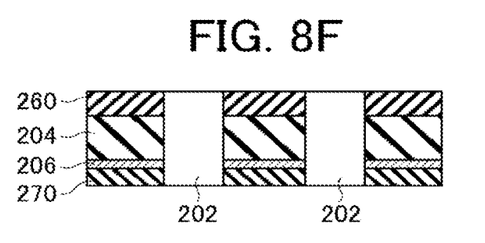

As illustrated in FIG. 8F, the insulating substrate 204, the high resistance film 206, and the protective film 270 are etched using the resist 260 as a mask to form openings 202.

Figure 8G:
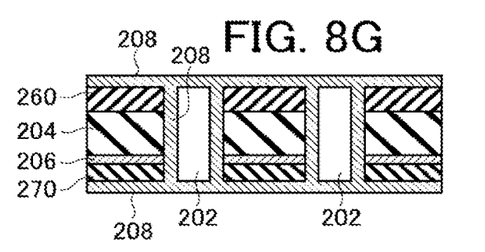

As illustrated in FIG. 8G, a conductive film 208 is formed so as to cover the sidewalls of the resist 260, the protective film 270, and the openings 202. The conductive film 208 is, for instance, a thin metal film such as a germanium or aluminum film.

Figure 8H:
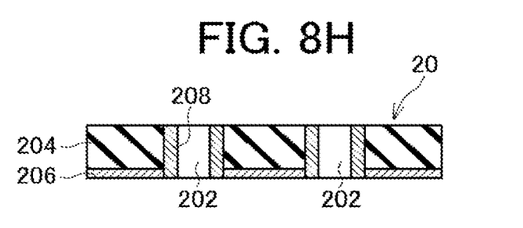

Subsequently, as illustrated in FIG. 8H, etching is performed on both sides of the substrate, and the resist 260 and the protective film 270 are removed. Consequently, an electric field shield plate 200 can be produced, in which the high resistance film 206 is stacked on the insulating substrate 204, and the conductive film 208 is formed on the sidewalls of the openings 202. The insulating substrate 204 can be prevented from being charged up by forming the conductive film 208 on the sidewalls of the openings 202.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An aperture set for multi-beam comprising:
a shaping aperture array in which a plurality of first openings are formed, and which receives irradiation of a charged particle beam discharged from a discharge unit in an area including the plurality of first openings, and forms a multi-beam by allowing part of the charged particle beam to pass through corresponding ones of the plurality of first openings;
a blanking aperture array in which a plurality of second openings are formed, through each of which a beam is passed, corresponding to part of the multi-beam, the plurality of second openings each including a pair of blanking electrodes that perform blanking deflection of a beam, the pair of blanking electrodes being provided oppositely across the second opening; and
an electric field shield plate that is disposed to be opposed to the blanking aperture array and includes a plurality of third openings, through each of which a beam is passed, corresponding to part of the multi-beam,
wherein the electric field shield plate has a substrate, and a high resistance film provided on a surface of the substrate, the surface being opposed to the blanking aperture array, and the high resistance film has a higher electric resistance than an electric resistance of the substrate.

2. The aperture set for multi-beam according to claim 1, wherein the substrate is a conductive substrate, and an insulation film is provided between the substrate and the high resistance film.

3. The aperture set for multi-beam according to claim 1, wherein a metal film is provided on sidewalls of the third openings.

4. The aperture set for multi-beam according to claim 1, wherein the substrate is connected to an electrical ground.

5. The aperture set for multi-beam according to claim 1, wherein an interval between a front end of the blanking electrodes and a surface of the high resistance film is smaller than an arrangement pitch of the blanking electrodes.

6. The aperture set for multi-beam according to claim 1, wherein a diameter of the third openings is greater than a diameter of the second openings.

7. The aperture set for multi-beam according to claim 1, further comprising
a contrast aperture that blocks a scattered electron which occurs in the shaping aperture array.

8. An aperture set for multi-beam comprising:
a shaping aperture array in which a plurality of first openings are formed, and which receives irradiation of a charged particle beam discharged from a discharge unit in an area including the plurality of first openings, and forms a multi-beam by allowing part of the charged particle beam to pass through corresponding ones of the plurality of first openings;
a blanking aperture array in which a plurality of second openings are formed, through each of which a beam is passed, corresponding to part of the multi-beam, the plurality of second openings each including a pair of blanking electrodes that perform blanking deflection of a beam; and
an electric field shield plate that is disposed to be opposed to the blanking aperture array and includes a plurality of third openings through which the multi-beam is passed,
wherein the electric field shield plate has an insulating substrate, and a high resistance film provided on a surface of the insulating substrate, the surface being opposed to the blanking aperture array, and a conductive film provided on sidewalls of the plurality of third openings, and the high resistance film has a higher electrical resistance value in a surface direction than an electrical resistance value of the blanking electrodes.

9. The aperture set for multi-beam according to claim 8, wherein an interval between a front end of the blanking electrodes and a surface of the high resistance film is smaller than an arrangement pitch of the blanking electrodes.

10. The aperture set for multi-beam according to claim 8, wherein a diameter of the third openings is greater than a diameter of the second openings.

11. The aperture set for multi-beam according to claim 8, further comprising
a contrast aperture that blocks a scattered electron which occurs in the shaping aperture array.

12. An aperture set for multi-beam comprising:
a shaping aperture array in which a plurality of first openings are formed, and which receives irradiation of charged particle beams discharged from a discharge unit in an area including the plurality of first openings, and forms a multi-beam by allowing part of the charged particle beams to pass through corresponding ones of the plurality of first openings;
a blanking aperture array in which a plurality of second openings are formed, through each of which a beam is passed, corresponding to part of the multi-beam, the plurality of second openings each including a pair of blanking electrodes that perform blanking deflection of a beam; and
an electric field shield plate that is disposed to be opposed to the blanking aperture array and includes a plurality of third openings through which the multi-beam is passed, wherein the electric field shield plate is composed of a high resistance material having a higher electrical resistance value than an electrical resistance value of the blanking electrodes.

13. The aperture set for multi-beam according to claim 12, wherein an interval between a front end of the blanking electrodes and a surface of the electric field shield plate is smaller than an arrangement pitch of the blanking electrodes.

14. The aperture set for multi-beam according to claim 12, wherein a diameter of the third openings is greater than a diameter of the second openings.

15. The aperture set for multi-beam according to claim 12, further comprising
a contrast aperture that blocks a scattered electron which occurs in the shaping aperture array.

* * * * *